(12) United States Patent
Park et al.

(10) Patent No.: US 9,209,207 B2
(45) Date of Patent: Dec. 8, 2015

(54) FLEXIBLE DISPLAY WITH BENT EDGE REGIONS

(71) Applicant: Apple Inc., Cupertino, CA (US)

(72) Inventors: Young Bae Park, San Jose, CA (US); Shih Chang Chang, Cupertino, CA (US); Vasudha Gupta, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/199,871

(22) Filed: Mar. 6, 2014

(65) Prior Publication Data

US 2014/0299884 A1    Oct. 9, 2014

Related U.S. Application Data

(60) Provisional application No. 61/810,199, filed on Apr. 9, 2013.

(51) Int. Cl.
*H01L 27/12* (2006.01)
*H01L 51/00* (2006.01)
*H01L 27/32* (2006.01)

(52) U.S. Cl.
CPC ........ *H01L 27/1259* (2013.01); *H01L 27/1218* (2013.01); *H01L 27/3276* (2013.01); *H01L 51/0097* (2013.01); *H01L 2251/5338* (2013.01); *Y02E 10/549* (2013.01)

(58) Field of Classification Search
CPC ............ H01L 27/1259; H01L 27/3276; H01L 27/1218; H01L 51/0097
USPC .................................. 438/34, 35; 257/72, 91
See application file for complete search history.

(56) References Cited

U.S. PATENT DOCUMENTS

| 4,066,855 A | 1/1978 | Zenk |
| 4,085,302 A | 4/1978 | Zenk et al. |

(Continued)

FOREIGN PATENT DOCUMENTS

| EP | 2187443 | 5/2010 |
| JP | 9321083 | 12/1997 |

(Continued)

OTHER PUBLICATIONS

Martisauskas et al., U.S. Appl. No. 13/229,120, filed Sep. 9, 2011.

(Continued)

*Primary Examiner* — Allan R Wilson
(74) *Attorney, Agent, or Firm* — Treyz Law Group, P.C.; G. Victor Treyz; Zachary D. Hadd

(57) ABSTRACT

An electronic device may have a flexible display with portions that are bent along a bend axis. The display may have display circuitry such as an array of display pixels in an active area. Contact pads may be formed in an inactive area of the display. Signal lines may couple the display pixels to the contact pads. The signal lines may overlap the bend axis in the inactive area of the display. During fabrication, an etch stop may be formed on the display that overlaps the bend axis. The etch stop may prevent over etching of dielectric such as a buffer layer on a polymer flexible display substrate. A layer of polymer that serves as a neutral stress plane adjustment layer may be formed over the signal lines in the inactive area of the display. Upon bending, the neutral stress plane adjustment layer helps prevent stress in the signal lines.

16 Claims, 13 Drawing Sheets

(56) References Cited

U.S. PATENT DOCUMENTS

| | | |
|---|---|---|
| 5,235,451 A | 8/1993 | Bryan |
| 5,436,745 A | 7/1995 | Voisin et al. |
| 5,483,261 A | 1/1996 | Yasutake |
| 5,488,204 A | 1/1996 | Mead et al. |
| 5,825,352 A | 10/1998 | Bisset et al. |
| 5,835,079 A | 11/1998 | Shieh |
| 5,880,411 A | 3/1999 | Gillespie et al. |
| 6,188,391 B1 | 2/2001 | Seely et al. |
| 6,310,610 B1 | 10/2001 | Beaton et al. |
| 6,323,846 B1 | 11/2001 | Westerman et al. |
| 6,504,530 B1 | 1/2003 | Wilson et al. |
| 6,690,387 B2 | 2/2004 | Zimmerman et al. |
| 6,803,245 B2 | 10/2004 | Auch et al. |
| 6,956,633 B2 | 10/2005 | Okada et al. |
| 7,015,894 B2 | 3/2006 | Morohoshi |
| 7,034,913 B2 | 4/2006 | Ishida |
| 7,184,064 B2 | 2/2007 | Zimmerman et al. |
| 7,453,542 B2 | 11/2008 | Muramatsu et al. |
| 7,541,671 B2 | 6/2009 | Foust et al. |
| 7,593,086 B2 | 9/2009 | Jeong et al. |
| 7,593,087 B2 | 9/2009 | Jang |
| 7,663,607 B2 | 2/2010 | Hotelling et al. |
| 7,767,048 B2 | 8/2010 | Kanbayashi |
| 7,787,917 B2 | 8/2010 | Aoki et al. |
| 7,834,451 B2 | 11/2010 | Lee et al. |
| 7,936,405 B2 | 5/2011 | Kitagawa |
| 8,134,675 B2 | 3/2012 | Kawaguchi et al. |
| 8,194,048 B2 | 6/2012 | Oowaki |
| 8,232,556 B2 * | 7/2012 | Arasawa et al. ............ 257/72 |
| 2004/0079941 A1 * | 4/2004 | Yamazaki et al. ............ 257/40 |
| 2005/0285990 A1 | 12/2005 | Havelka et al. |
| 2006/0026521 A1 | 2/2006 | Hotelling et al. |
| 2006/0197753 A1 | 9/2006 | Hotelling |
| 2006/0202206 A1 | 9/2006 | Koyama et al. |
| 2007/0148831 A1 | 6/2007 | Nagata et al. |
| 2008/0117376 A1 | 5/2008 | Takenaka |
| 2009/0027896 A1 | 1/2009 | Nishimura et al. |
| 2009/0167171 A1 | 7/2009 | Jung et al. |
| 2009/0201635 A1 | 8/2009 | Kim et al. |
| 2009/0256471 A1 | 10/2009 | Kim et al. |
| 2009/0284688 A1 | 11/2009 | Shiraishi et al. |
| 2009/0315837 A1 | 12/2009 | Geiger |
| 2010/0007817 A1 | 1/2010 | Kim |
| 2010/0026952 A1 | 2/2010 | Miura et al. |
| 2010/0096633 A1 * | 4/2010 | Hatano et al. ............ 257/59 |
| 2010/0208190 A1 | 8/2010 | Yoshida |
| 2010/0225624 A1 | 9/2010 | Fu et al. |
| 2010/0315399 A1 | 12/2010 | Jacobson et al. |
| 2011/0001146 A1 | 1/2011 | Yamazaki et al. |
| 2011/0007042 A1 | 1/2011 | Miyaguchi |
| 2011/0086680 A1 | 4/2011 | Kim et al. |
| 2011/0204424 A1 * | 8/2011 | Arasawa et al. ............ 257/288 |
| 2011/0227846 A1 | 9/2011 | Imazeki |
| 2012/0062447 A1 | 3/2012 | Tseng et al. |
| 2012/0127087 A1 | 5/2012 | Ma |
| 2012/0146886 A1 | 6/2012 | Minami et al. |
| 2012/0218219 A1 | 8/2012 | Rappoport et al. |
| 2012/0248478 A1 * | 10/2012 | Lee et al. ............ 257/91 |
| 2013/0056243 A1 * | 3/2013 | Kim et al. ............ 174/250 |
| 2014/0016285 A1 * | 1/2014 | Miyaguchi ............ 361/749 |
| 2014/0353670 A1 * | 12/2014 | Youn et al. ............ 257/72 |
| 2015/0053959 A1 * | 2/2015 | Yamazaki et al. ............ 257/40 |
| 2015/0108463 A1 * | 4/2015 | Hatano et al. ............ 257/40 |

FOREIGN PATENT DOCUMENTS

| | | |
|---|---|---|
| JP | 2000163031 | 6/2000 |
| JP | 2002342033 | 11/2002 |
| JP | 2010060866 | 3/2010 |
| WO | 9604682 | 2/1996 |
| WO | 0169577 | 9/2001 |

OTHER PUBLICATIONS

Chen et al., U.S. Appl. No. 13/186,238, filed Jul. 19, 2011.
Drzaic et al., U.S. Appl. No. 13/252,971, filed Oct. 4, 2011.
Franklin et al., U.S. Appl. No. 13/250,227, filed Sep. 30, 2011.
Franklin et al., U.S. Appl. No. 13/250,666, filed Sep. 30, 2011.
Franklin et al., U.S. Appl. No. 13/310,409, filed Dec. 2, 2011.
Franklin et al., U.S. Appl. No. 13/422,724, filed Mar. 16, 2011.
Lynch, U.S. Appl. No. 13/184,303, filed Jul. 15, 2011.
Myers et al., U.S. Appl. No. 13/108,256, filed May 16, 2011.
Myers et al., U.S. Appl. No. 13/246,510, filed Sep. 27, 2011.
Park et al., U.S. Appl. No. 13/591,095, filed Feb. 28, 2011.
Chen et al., U.S. Appl. No. 13/585,666, filed Aug. 14, 2012.
Raff et al., U.S. Appl. No. 13/452,061, filed Apr. 20, 2012.
Rappoport et al., U.S. Appl. No. 13/249,734, filed Sep. 30, 2011.
Rappoport et al., U.S. Appl. No. 13/273,851, filed Oct. 14, 2011.
Rothkopf et al., U.S. Appl. No. 13/171,295, filed Jun. 28, 2011.
Rothkopf et al., U.S. Appl. No. 13/177,165, filed Jul. 6, 2011.
Lee, S.K. et al., (Apr. 1985). "A multi-touch three dimensional touch-sensitive tablet," Proceedings of CHI: ACM Conference on Human Factors in Computing Systems, pp. 21-25.
Rubine, D.H., (Dec. 1991). "The automatic recognition of gestures," CMU-CS-91-202, Submitted in partial fulfillment of the requirements for the degree of doctor of philosophy in computer science at Carnegie Mellon University, 285 pages.
Rubine, D.H. (May 1992). "Combining gestures and direct manipulation," CHI 92, pp. 659-660.
Westermand, W. (Spring 1999). "Hand tracking, finger identification, and chordic manipulation on a multi-touch surface," A dissertation submitted to the faculty of the University of Delaware in partial fulfillment of the requirements for the Degree of Doctor of Philosophy in Electrical Engineering, 364 pages.

* cited by examiner

FLEXIBLE DISPLAY WITH BENT EDGE REGIONS

This application claims priority to U.S. provisional patent application No. 61/810,199 filed Apr. 9, 2013, which is hereby incorporated by reference herein in its entirety.

BACKGROUND

This relates generally to electronic devices, and more particularly, to electronic devices with displays.

Electronic devices often include displays. For example, cellular telephones and portable computers often include displays for presenting information to a user.

It can be challenging to form displays for electronic devices. Displays have active areas formed from arrays of display pixels. Inactive border regions surround the active regions. The inactive border region in a display contains support circuitry such as signal lines and thin-film transistor circuitry but does not contain active pixels for producing images for a user. To reduce the apparent size of the inactive border region, it may be desirable to use a flexible substrate in forming the display. This allows portions of the inactive border region to be bent out of sight, thereby reducing the size of the visible inactive display border and enhancing the appearance of the display.

Challenges arise when forming displays with bent edges. If care is not taken, structures within the display may be damaged when attempting to fabricate a display that can accommodate bending and structures such as metal signal lines can crack. Damage to display components may cause the display to fail prematurely.

It would therefore be desirable to be able to provide improved displays for electronic devices.

SUMMARY

An electronic device may be provided with a flexible display. The display may have portions that are bent along a bend axis. For example, the edges of the display may be bent to help hide inactive display components from view by a user of the electronic device.

The display may have display circuitry such as an array of display pixels in an active area of the display. The active area may, for example, have a rectangular shape. The display may also have signal lines, contact pads, and other structures in the inactive area of the display. The inactive area may, for example, have the shape of a rectangular ring that surrounds the active area.

The display circuitry may be formed on a substrate such as a flexible polymer substrate. A buffer layer may be deposited on the polymer substrate before other display structures are formed to help prevent the escape of contamination from the polymer substrate.

The display may have portions that are bent along a bend axis. Signal lines may couple display pixels in the active area of the display to contact pads or other structures in the inactive area of the display. The signal lines may overlap the bend axis in the inactive area of the display. During fabrication, an etch stop may be formed on the display that overlaps the bend axis. The etch stop may prevent over-etching of dielectric such as the buffer layer on the surface of the flexible polymer substrate while dry etching is being performed to remove interlayer dielectric in the inactive area to prepare the display for bending. A layer of polymer that serves as a neutral stress plane adjustment layer may be formed over the signal lines in the inactive area of the display. Upon bending, the neutral stress plane adjustment layer helps prevent stress from developing in the bent signal lines.

Further features of the invention, its nature and various advantages will be more apparent from the accompanying drawings and the following detailed description of the preferred embodiments.

DETAILED DESCRIPTION

Electronic devices may include displays. The displays may be used to display images to a user. Illustrative electronic devices that may be provided with displays are shown in FIGS. 1, 2, 3, and 4.

Figure 1:
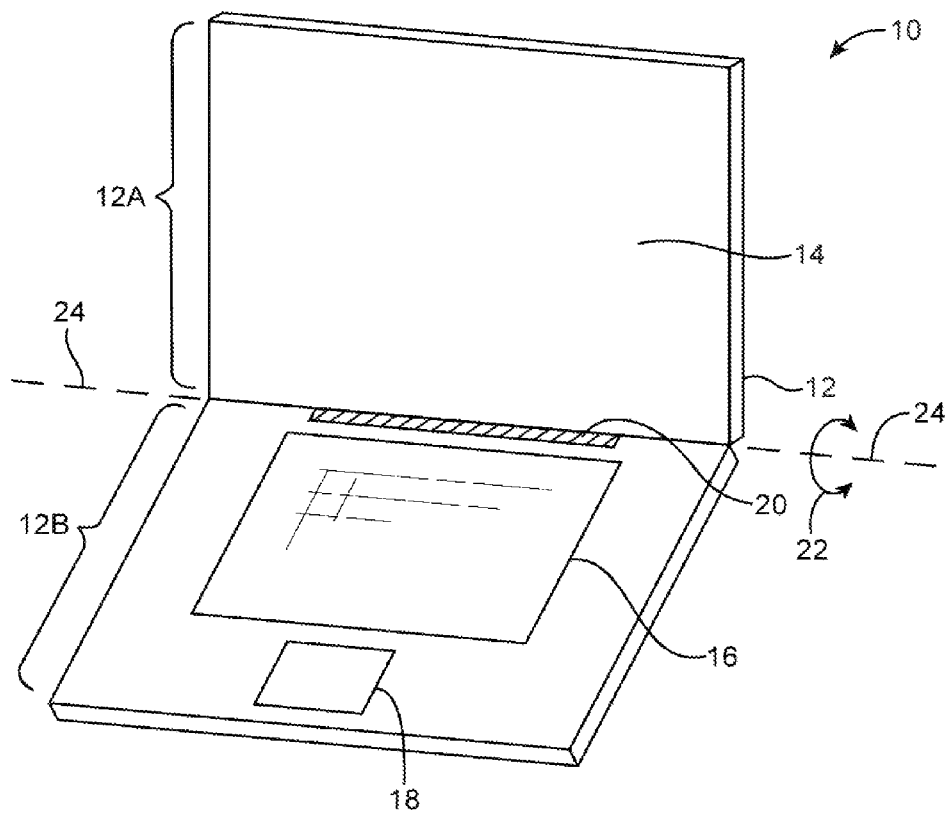
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
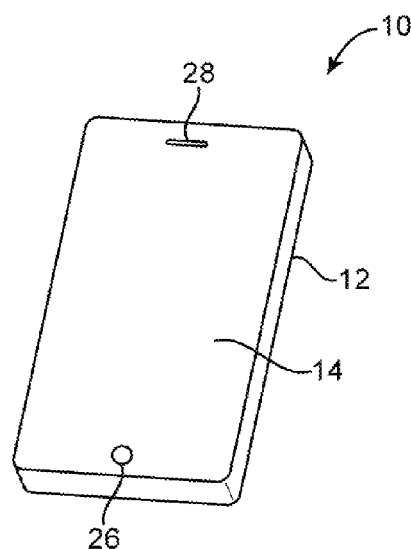
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
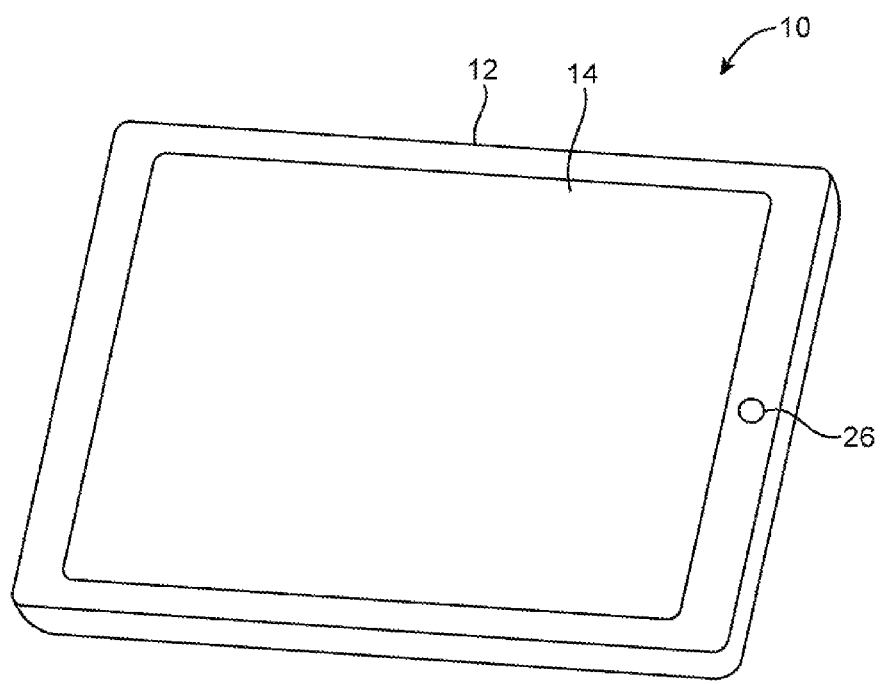
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
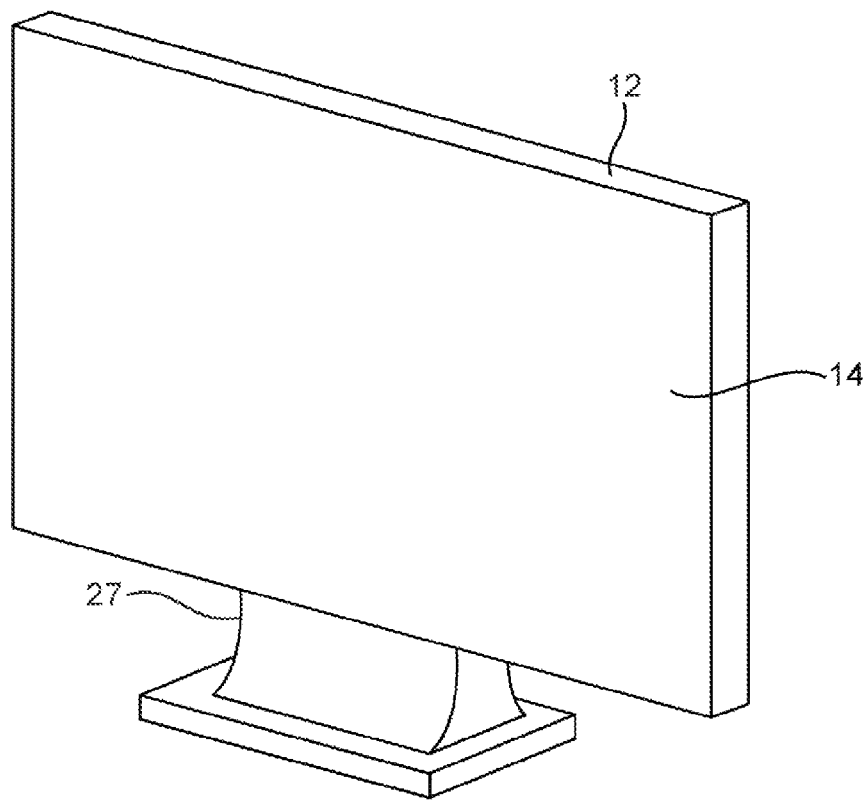
FIG. 4 is a perspective view of an illustrative electronic device such as a computer display with display structures in accordance with an embodiment of the present invention.

FIG. 4 shows how electronic device 10 may be a computer or television display or a computer that has been integrated into a display. With this type of arrangement, housing 12 for device 10 may be mounted on a support structure such as stand 27. Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from organic light-emitting diode components or other suitable display pixel structures. An optional display cover layer such as a planar or curved transparent glass or plastic sheet or other transparent member may be cover the outer surface of display 14 (if desired). Edge portions of display 14 may be bent to hide inactive border regions of display 14 from view or display 14 may otherwise be provided with bend (curved) portions.

To ensure that bending operations do not damage display 14, display 14 may be provided with a layer of material such as a polymer layer that helps move the neutral stress plane of the bent portion of the display into alignment with metal lines and other sensitive circuitry. This helps avoid damage to the sensitive circuitry when the edge or other portion of the display is bent.

Figure 5:
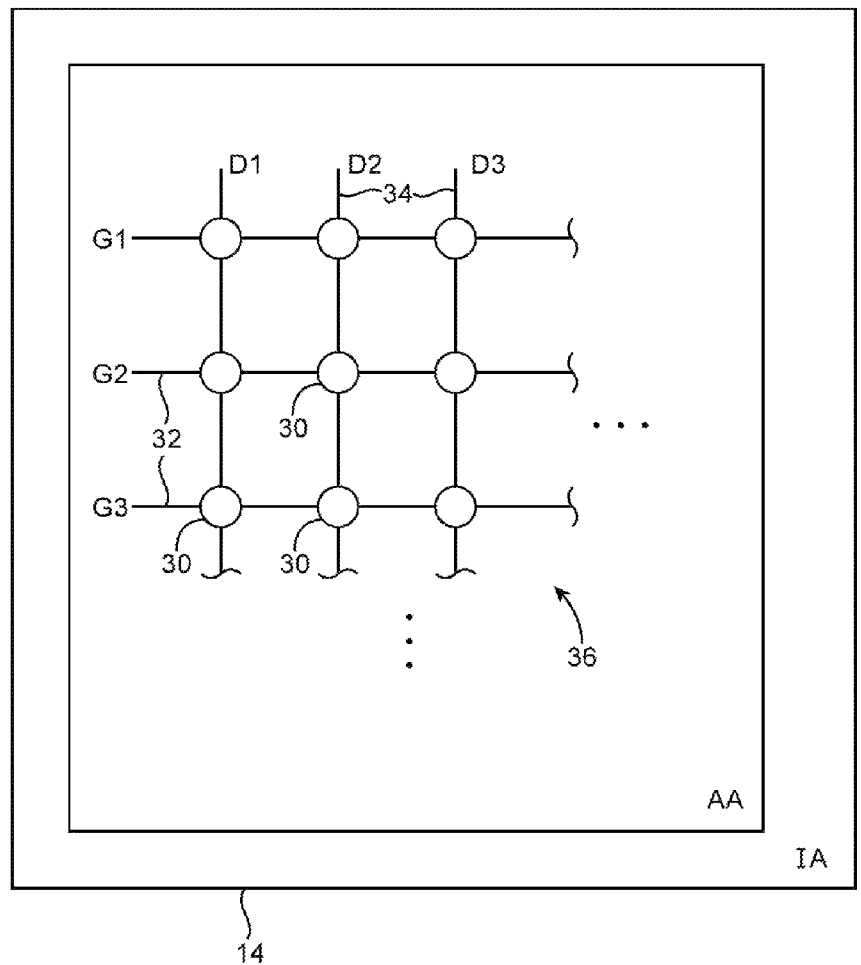
FIG. 5 is diagram of an array of display pixels in a display in accordance with an embodiment of the present invention.

FIG. 5 is a top view display 14. As shown in FIG. 5, display 14 may include display pixel array 36. Display pixel array 36 includes rows and columns of display pixels 30. Display pixels 30 may be, for example, organic light-emitting-diode pixels. Gate lines 32 and data lines 34 may be used to supply control signals to the array of display pixels 30. Display pixel array 36 may have a rectangular shape in the center of display 14. Display pixel array 36 may form an active region (active area AA) of display 14 that displays images to a user of device 10. The active area AA of display 14 may be surrounded by an inactive border region such as rectangular ring-shaped inactive area IA of FIG. 5. Inactive area IA may contain support circuitry such as thin-film transistors in display control circuitry and other thin-film transistor circuits, signal lines formed from metal traces, contact pads, and other display circuitry that does not emit light for creating images for the user. The support circuitry in inactive area IA and the circuitry of display pixel array 36 in active area AA may potentially be subjected to stresses when display 14 is bent. By removing structures such as potentially brittle interlayer dielectric materials and placing flexible layers such as layers of polymer in inactive region IA, the potential for damage to the structures of display 14 in the bent region may be minimized.

Figure 6:
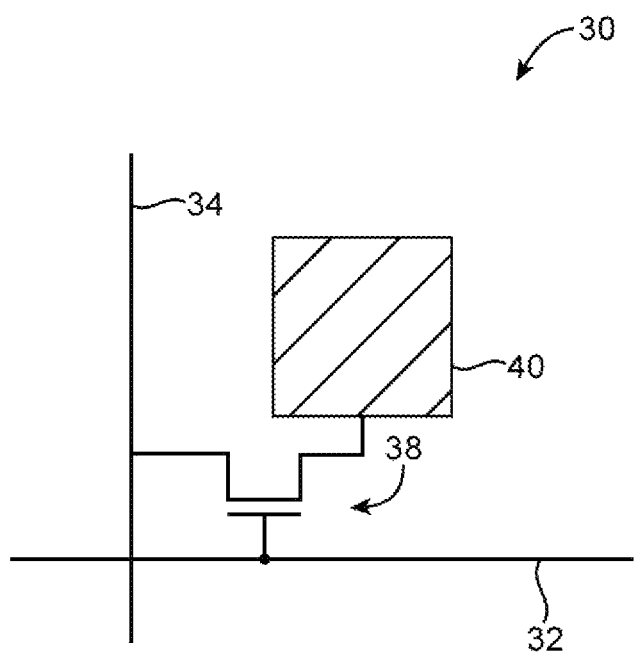
FIG. 6 is a circuit diagram of an illustrative display pixel in a display in accordance with an embodiment of the present invention.

FIG. 6 is a circuit diagram of an illustrative organic light-emitting diode display pixel 30. As shown in FIG. 6, display pixel 30 may have thin-film transistor circuitry such as one or more thin-film transistors 38. Thin-film transistor 38 in the example of FIG. 6 is coupled between one of data lines 34 and a patch of light-emitting organic material 40 and has a gate terminal coupled to one of gate lines 32. Other types of display pixels 30 may be used in display pixel array 36 of display 14 if desired (e.g., display pixels with two or more, three or more, or four or more transistors). The example of FIG. 6 is merely illustrative.

Figure 7:
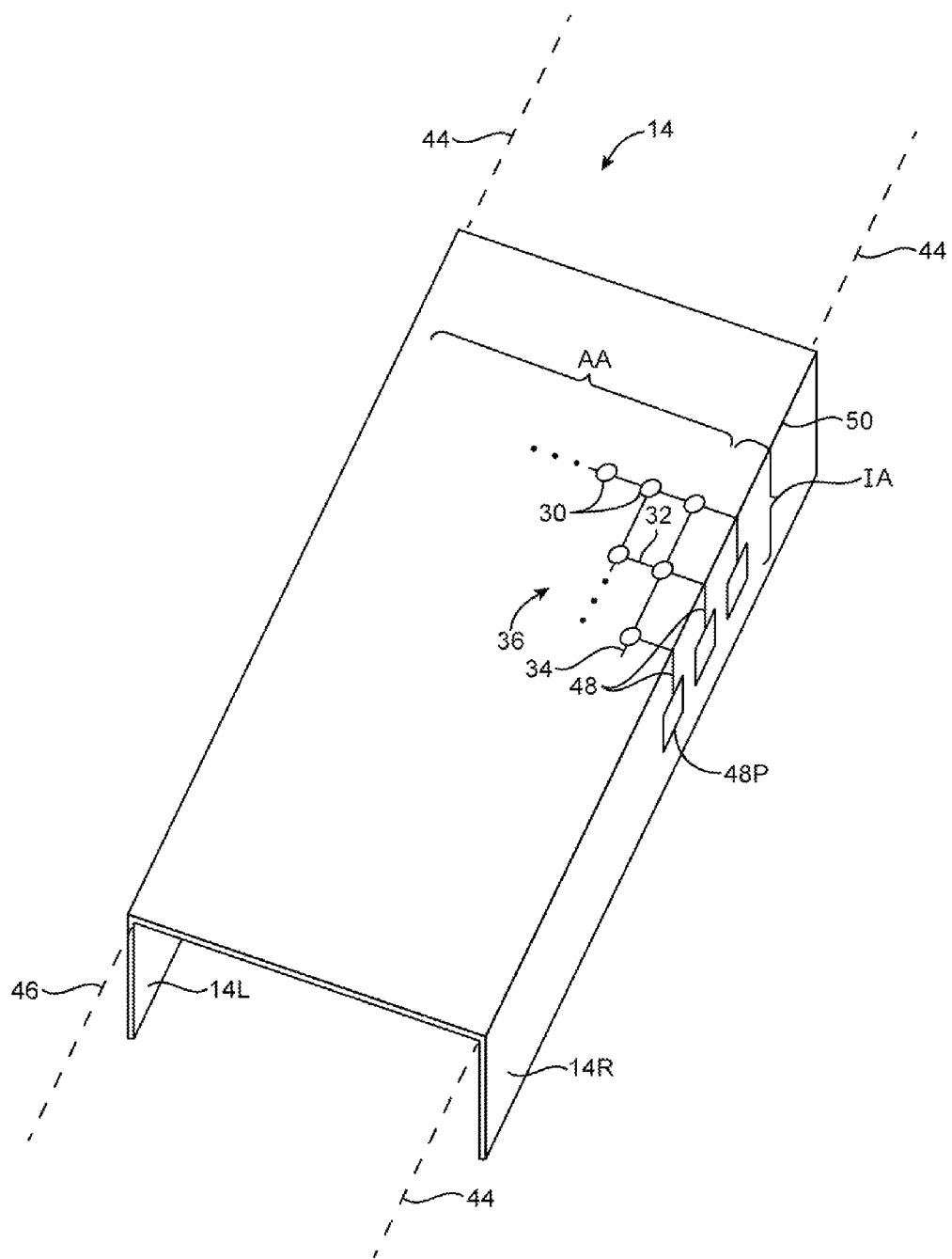
FIG. 7 is a perspective view of an illustrative display with bent edges in accordance with an embodiment of the present invention.

FIG. 7 is a perspective view of display 14 in an illustrative configuration in which the right and left edges of display 14 have been bent. In general, one or more edges of display 14 may be bent (e.g., one edge may be bent, two edges may be bent, three edges may be bent, or four edges may be bent). The arrangement of FIG. 7 in which there are two opposing bend edges in display 14 is merely illustrative.

As shown in FIG. 7, left edge 14L and right edge 14R are each bent along a respective bend axis 44. Display 14 may have display support circuitry that is formed from thin-film transistors on a flexible substrate. Integrated circuits such as display driver integrated circuits mounted on display 14 or coupled to display 14 through a signal bus may also be used as display support circuitry. One or more contacts such as contact pads 48P may be coupled to respective integrated circuit pads on an integrated circuit using solder, may be coupled to respective contacts on a flexible printed circuit bus, may be coupled to connector contacts, or may be coupled to other circuitry.

In active area AA, display pixels 30 may be arranged to form array 36. Control lines 32 and 34 may convey control signals to display pixels 30. Inactive area IA may overlap bend axis 44. In this region, conductive lines such as signal lines 48 may overlap bend axis 44 and bend 50 in display 14. Lines 48 may be formed from metal traces and may be coupled to control lines in array 36 such as lines 32 and/or lines 34. Lines (metal traces) 48 may be coupled to respective contacts such as contacts 48P. Contacts 48P, which may sometimes be referred to as contact pads, may be connected to integrated circuits, signal bus cables, connectors, and other circuits.

Figure 8:
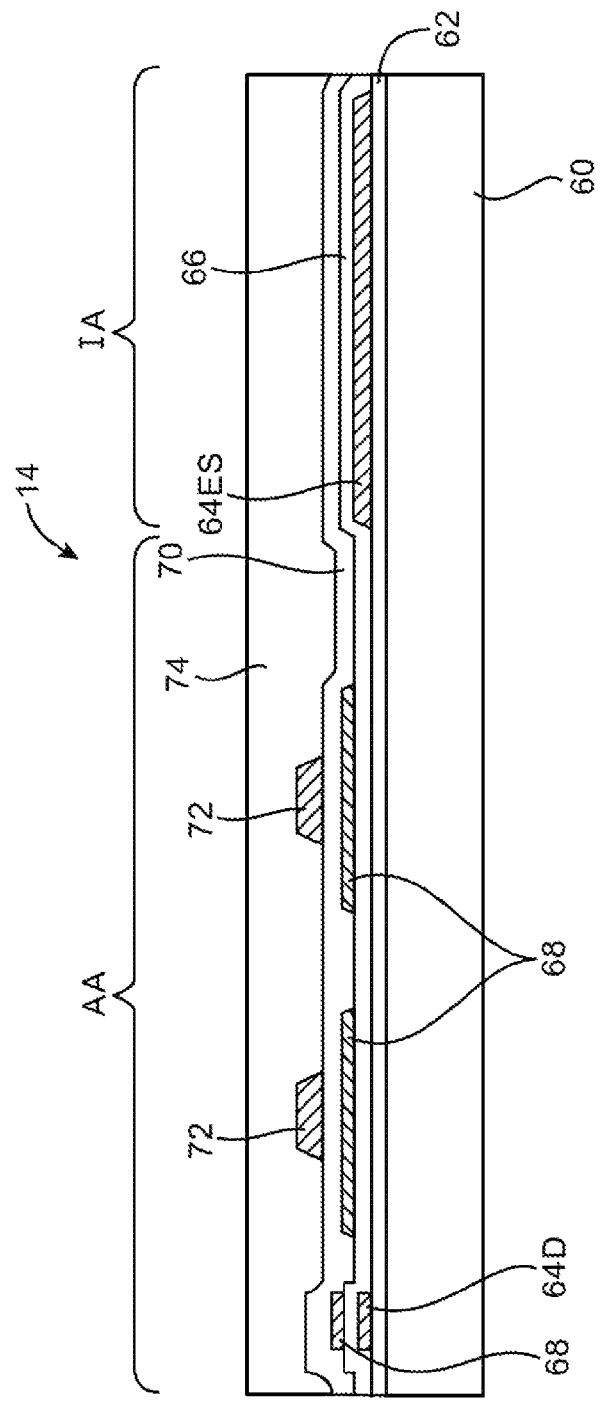
FIG. 8 is a cross-sectional side view of an illustrative display following deposition of interlayer dielectric in accordance with an embodiment of the present invention.

Display 14 may be formed by depositing and patterning layers of dielectric and conductive material on a flexible substrate. A cross-sectional view of an illustrative partly formed version of display 14 is shown in FIG. 8. As shown in FIG. 8, display 14 may have a flexible substrate such as flexible substrate 60. Substrate 60 may be a flexible dielectric layer such as a layer of polyimide, polyethylene naphthalate (PEN), polyethersulfone (PES), or a sheet of other flexible polymer. A buffer layer such as silicon dioxide or other inert dielectric (e.g., inorganic dielectric) such as layer 62 may be deposited on the upper surface of substrate 60 to prevent outgassing of solvent residue and other contaminants that might otherwise contaminate the display pixel structures formed on display 14 during high temperature processing steps. Layer 62 may have a thickness of about 100 nm (e.g., about 30-200 nm) and may therefore be sufficiently thin to be bend without cracking (i.e., layer 62 may be sufficiently thin to ensure that layer 62 is flexible and can be bent at a right angle or other suitable angle along bend axis 44 without damage).

Following formation of buffer layer 62, a patterned layer of material such as a metal, indium tin oxide, indium zinc oxide, or other material that can serve as an etch stop (i.e., etch stop 64E) in inactive region IA can be formed on top of buffer layer 62. As shown in FIG. 8, at the same time that layer 64E is being deposited and patterned in inactive area IA, the same material that is used in forming etch stop 64E can be used in forming active area structures such as structure 64D (e.g., metal structures or structures formed from an oxide containing indium that serve as light leakage blocking structures, portions of thin-film circuits, capacitor structures, etc.).

Following formation of structures 64D and 64ES, a layer such as thin-film transistor buffer layer 66 may be deposited. Layer 66 may be, for example, a silicon oxide layer, a silicon nitride layer, a layer that includes a silicon oxide sublayer and a silicon nitride sublayer, or other inorganic buffer layer.

Thin-film transistor devices can be formed on buffer layer 66 using semiconductor deposition processes. As an example, thin-film transistor polysilicon structures such as polysilicon layer structures 68 or other semiconductor transistor structures may be deposited using a process such as a low temperature polysilicon deposition process. Gate insulator 70 such as silicon dioxide or other inorganic dielectric may be deposited over polysilicon structures 68.

Following formation of gate insulator 70, metal structures 72 may be formed. Metal structures 72 may, for example, form transistor gates for the transistors associated with polysilicon layer 68. Metal gates 72 may each overlap a corresponding polysilicon thin-film transistor structure (see, e.g., polysilicon transistor structures 68 of FIG. 8). Metal layer 72 may sometimes be referred to as a first metal layer in display 14.

Layers such as metal layer 72 and the other layers of material in display 14 may be patterned using photolithography (e.g., deposition and development of photoresist, wet and dry etching, etc.). After the first metal layer (metal layer 72) for display 14 has been deposited, interlayer dielectric (ILD) 74 may be deposited. Interlayer dielectric 74 may be formed from a layer of silicon dioxide, silicon nitride, layers of silicon dioxide and silicon nitride, or other inorganic dielectric materials. Interlayer dielectric 74 may have a thickness that is greater than that of underlying layers such as buffer layer 62. For example, interlayer dielectric 74 may have layers of silicon dioxide and silicon nitride each of which has a thickness of about 300 nm (e.g., about 200 nm to 400 nm). Interlayer dielectric 74 may overlap both active area AA and inactive area IA.

To prevent cracking in interlayer dielectric 74, it may be desirable to remove interlayer dielectric 74 from the portion of display 14 that will overlap the display bend axis. It may, for example, be desirable to remove interlayer dielectric 74 from some or all of inactive area IA.

Figure 9:
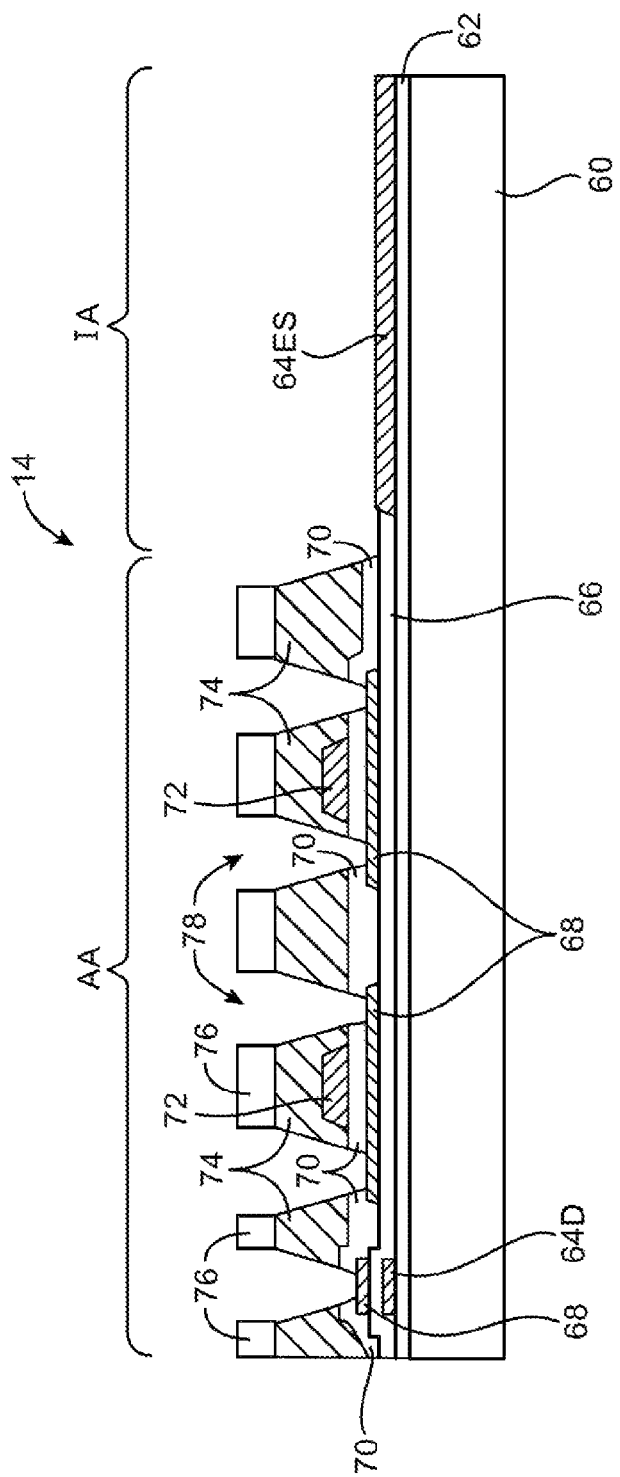
FIG. 9 is a cross-sectional side view the illustrative display of FIG. 8 following patterning of the interlayer dielectric in accordance with an embodiment of the present invention.

As shown in FIG. 9, a layer of patterned photoresist such as photoresist 76 may be formed on the upper surface of interlayer dielectric 74. Etching (e.g., dry etching) may be used to edge vias 78 in the uncovered portions of interlayer dielectric 74 in active area AA. At the same time, interlayer dielectric 74 is completely removed in inactive area IA (e.g., as part of the same dry etching process). Etch stop layer 64ES exhibits a substantially slower etch rate than interlayer dielectric 74 during the dry etch process. Due to the presence of etch stop layer 64ES, the dry etch process stops at layer 64ES and does not penetrate buffer layer 62. This ensures that buffer layer 62 will not be removed during the process of etching interlayer dielectric 74 to form vias 78, even when the dry etch process for vias 78 is completed sufficiently that the surfaces of polysilicon layer 68 are exposed at the bottom of vias 78.

Following formation of vias 78 in interlayer dielectric 74 and removal of interlayer dielectric 74 in inactive area IA above etch stop 64ES, etch stop 64ES and photoresist 76 can be removed. The structures in active area AA that were formed from the same layer as etch stop 64ES (i.e., structures such as structures 64D) may remain following removal of etch stop 64ES.

Figure 10:
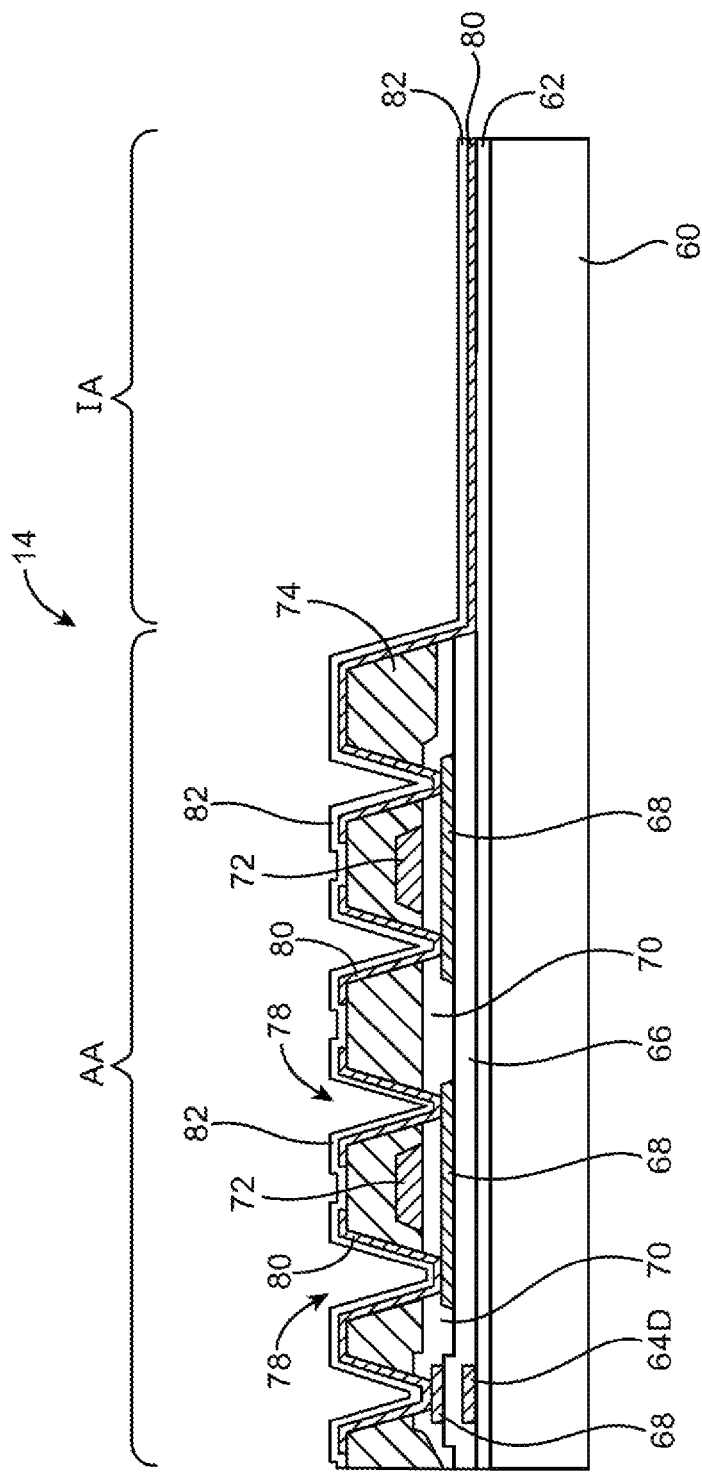
FIG. 10 is a cross-sectional side view of the illustrative display of FIG. 9 following formation of metal and passivation layers for the display in accordance with an embodiment of the present invention.

As shown in FIG. 10, a second layer of metal (metal 80) can be deposited in vias 78 to form electrical contact (source and drain contacts) with polysilicon 68. In inactive region IA, metal 80 may be patterned to form signal lines 48 of FIG. 7 to connect display pixel array 36 to contact pads 48P. Passivation layer 82 may be formed on layer 80. Passivation layer 82 may be formed from an inorganic dielectric such as silicon dioxide, silicon nitride, or other dielectric material.

If desired, openings in passivation layer 82 may be formed using photolithographic patterning (e.g., photolithography and etching). The openings may be formed in alignment with vias 78 in active area AA and contact pad regions 90 in inactive area IA. Following formation of the openings in passivation layer 82, contacts (e.g., contacts such as pads 48P of FIG. 7) may be formed by depositing and patterning contact metal (third metal) layer 86. Layer 86 may make contact with metal layer 80 in vias 78 and in contact pad regions 90. An integrated circuit may have contacts that are coupled to metal layer 86 in bonding pad regions 90 using solder or other structures such as metal traces on a flexible printed circuit may be coupled to metal layer 86 in regions 90.

Figure 11:
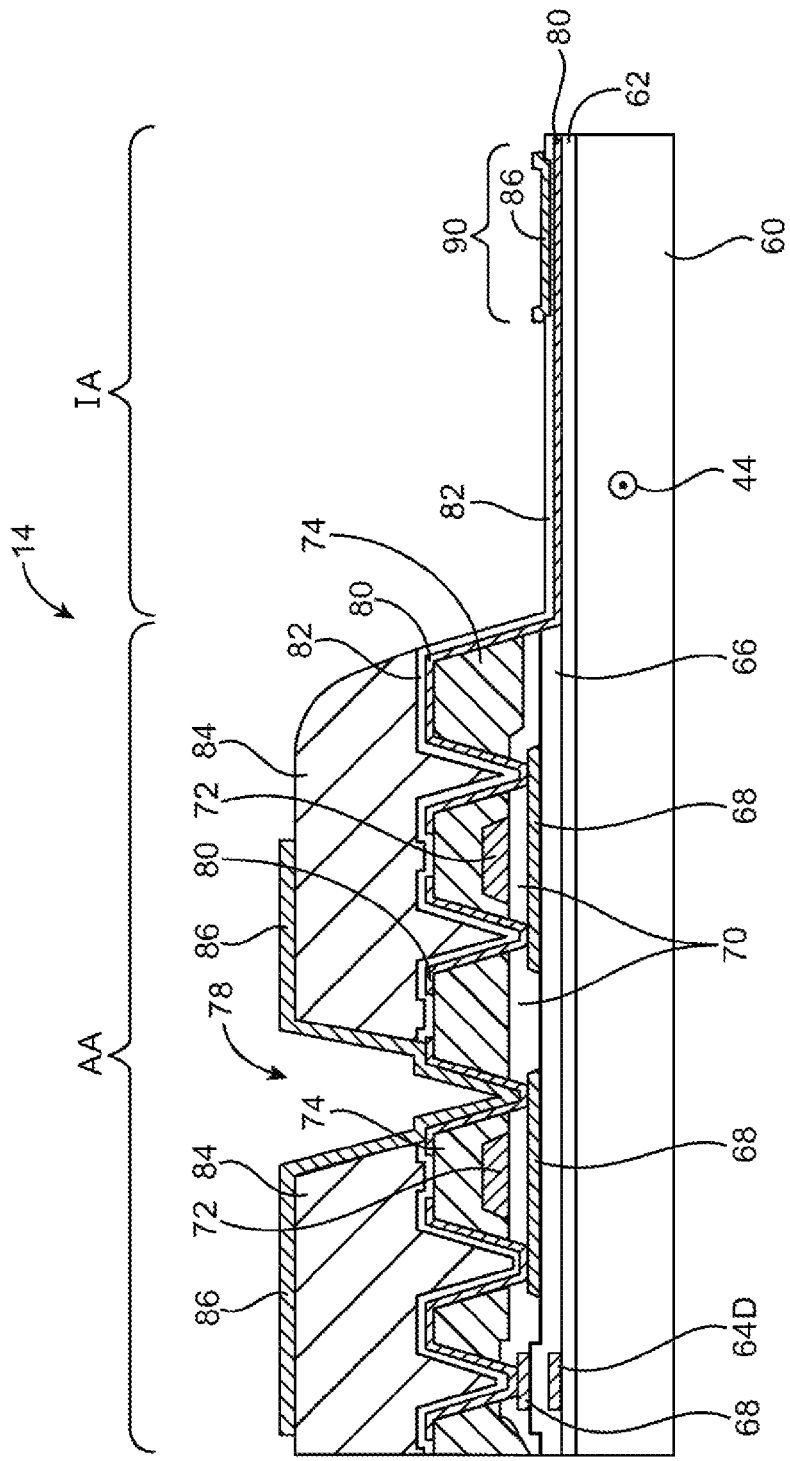
FIG. 11 is cross-sectional side view of the illustrative display of FIG. 10 following formation of contact pad structures in accordance with an embodiment of the present invention.
Figure 12:
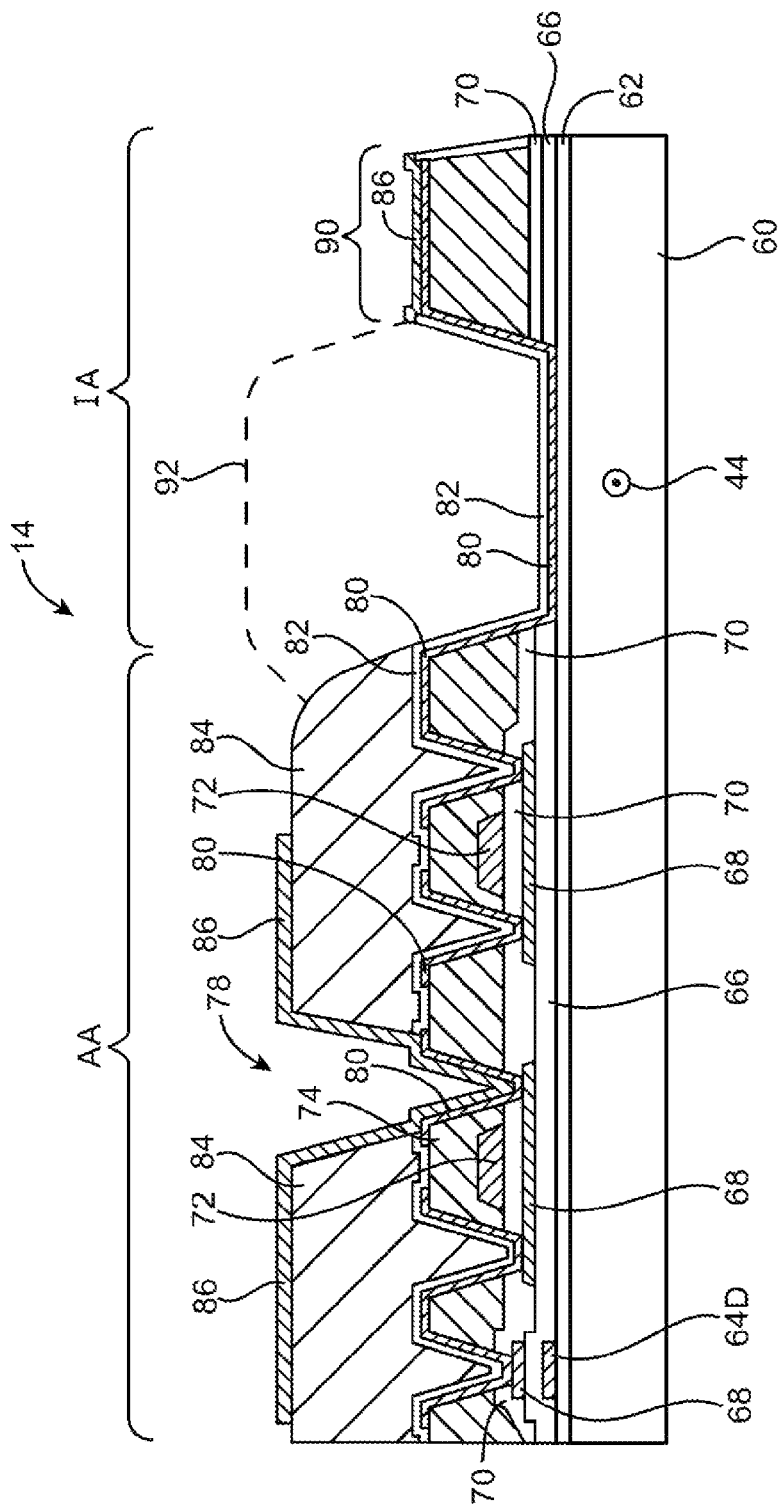
FIG. 12 is a cross-sectional side view of an illustrative display of the type shown in FIG. 11 in a configuration in which additional interlayer dielectric and contact pad structures are formed in an inactive portion of the display in accordance with an embodiment of the present invention.

As shown in FIG. 12, contacts in regions 90 may be formed on top of interlayer dielectric 74 (e.g., in a configuration in which some of interlayer dielectric 74 is retained along the outermost edge of inactive area IA). The configuration of FIG. 11 in which all of interlayer dielectric 74 is removed in inactive area IA is merely illustrative.

Following formation of contacts in region 90, display 14 may be bent around bend axis 44 (in the FIG. 11 example). The bend axis may lie within substrate 60 or may lie under substrate 60 (as examples). The portion of display 14 in inactive area IA that overlaps bend axis 44 may be free from interlayer dielectric 74, thereby avoiding the creation of cracks in interlayer dielectric 74 due to bending. Portions of layers 62, 80, and 82 may be present in the inactive area that overlaps bend axis 44, so these layers are preferably sufficiently thin and flexible to withstand the stresses introduced by bending display 14.

To further reduce stress for sensitive structures such as lines 48 formed from second metal layer 80, an additional layer of dielectric may be formed on top of the metal traces formed from layer 80 in region IA. This optional addition layer of dielectric, which is illustrated as additional layer 92 of FIG. 12, may be formed from a dielectric such as a polymer (e.g., epoxy, polyimide, etc.) or other suitable material.

Figure 13:
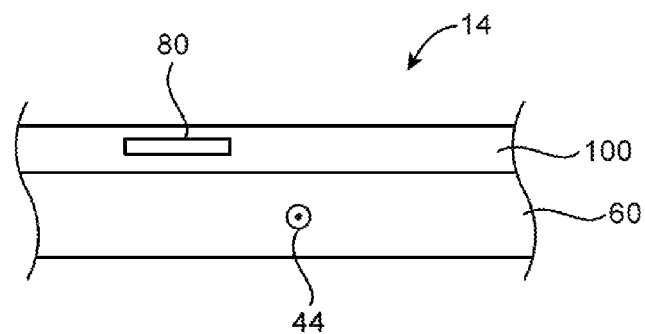
FIG. 13 is a cross-sectional side view of a portion of an illustrative flexible display prior to bending in accordance with an embodiment of the present invention.
Figure 14:
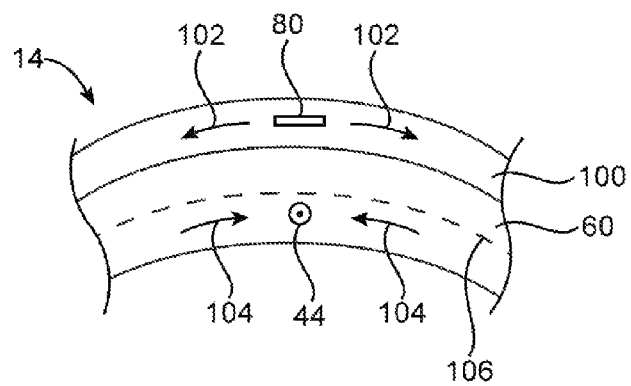
FIG. 14 is a cross-sectional side view of a portion of the illustrative display of FIG. 13 following bending of a portion of the display in accordance with an embodiment of the present invention.

Layer 92 helps reduce stress in the traces formed from metal layer 80 by shifting the neutral stress plane of display 14 into alignment with metal 80 (e.g., metal traces 48 formed from metal 80). Consider, as an example, an unbent (planar) display of the type shown in the cross-sectional side view of FIG. 13. As shown in FIG. 13, metal 80 may lie within display layer 100 on substrate 60. Layer 100 may include layers such as buffer layer 62 and passivation layer 82. Following bending of display 14 downwards about bend axis 44 of FIG. 14, the upper portions of layer 100 may be subjected to tensile stress, as indicated by arrows 102, whereas the lower portions of substrate 60 may be subjected to compressive stress, as indicated by arrows 104. There is a neutral stress plane 106 in display 14 of FIG. 14 where the tensile and compressive stresses from bending balance each other and result in a low amount of stress. As shown in FIG. 14, neutral stress plane 106 may lie within substrate 60 and out of alignment with metal 80 in the absence of additional polymer layer 92.

Figure 15:
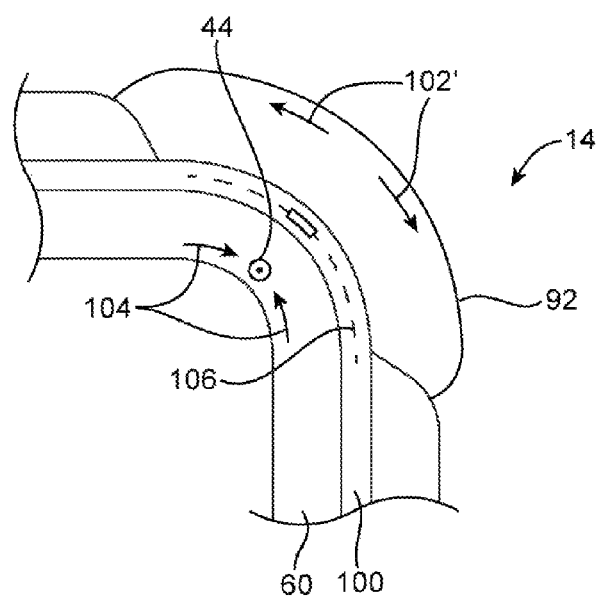
FIG. 15 is a cross-sectional side view of a portion of an illustrative display in which a layer of material that serves as a neutral stress plane adjustment layer has been added to the upper surface of the display to help reduce stress for metal structures in a bent portion of the display in accordance with an embodiment of the present invention.

In the presence of additional polymer layer 92 on the top of layer 100, tensile stress will develop within the upper portions of polymer layer 92 upon bending of display 14 about bend axis 44, as shown in FIG. 15. This will cause the neutral stress plane (i.e., the plane in which compressive stress 104 in substrate 60 is compensated by tensile stress 102' in layer 92) to move into vertical alignment with metal 80 (i.e., traces 48). By selecting the thickness and material properties of layer 92, neutral stress plane 106 can be configured to minimize stress in metal structures 80, even in situations in which display 14 is bent at a right angle (90° angle), as shown in FIG. 15.

Figure 16:
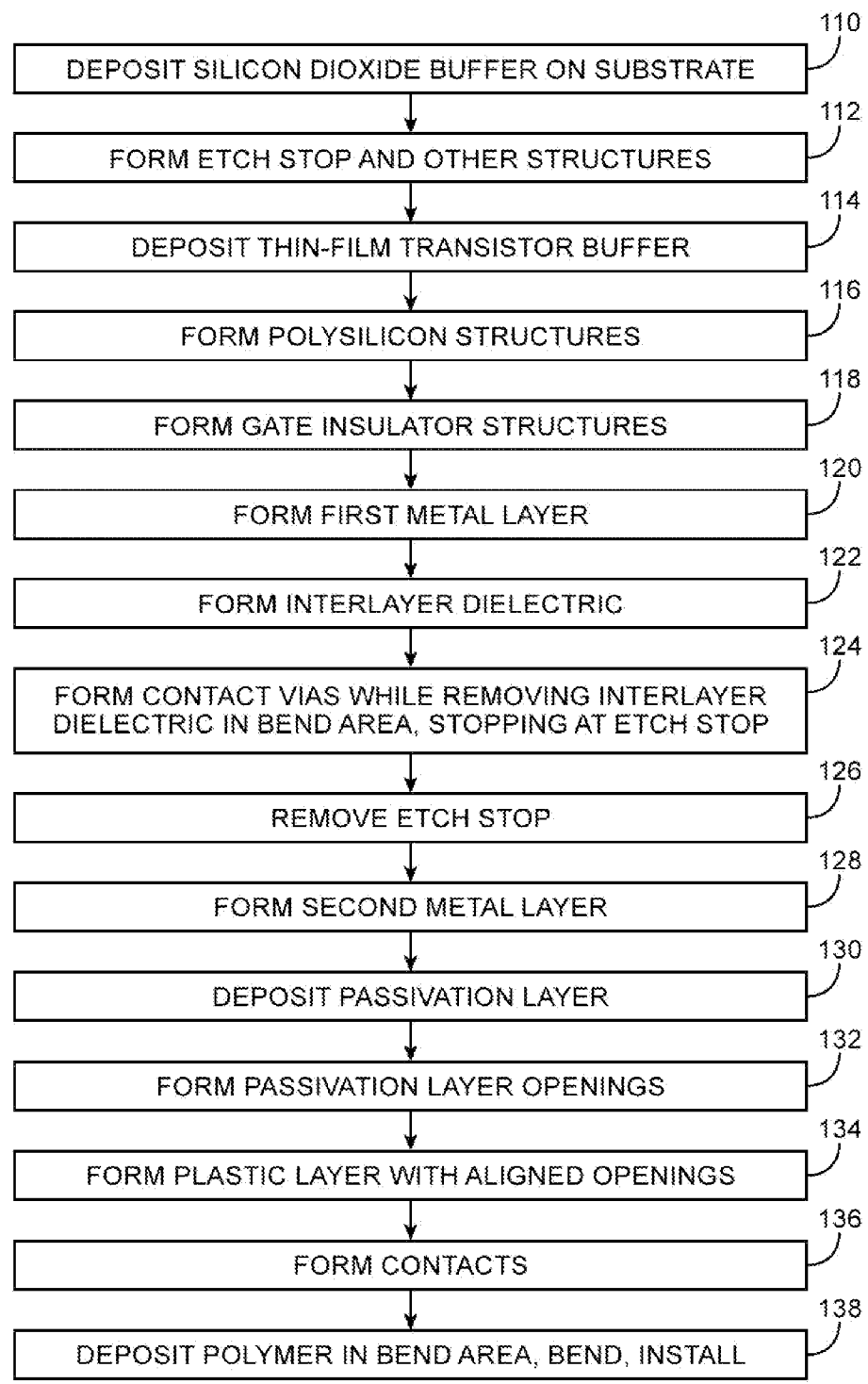
FIG. 16 is a flow chart of illustrative steps involved in forming a display with a bent edge region in accordance with an embodiment of the present invention.

FIG. 16 is a flow chart of illustrative steps involved in forming an electronic device such as electronic device 10 with a display such as display 14 having one or more bent edges.

At step 110, a buffer layer such as a silicon dioxide layer or other buffer layer 62 may be deposited on substrate 60.

At step 112, structures such as etch stop 64ES and, if desired, structures 64D in active area AA may be formed on buffer layer 62. Structures such as structures 64ES and 64D may be formed by depositing a metal layer or a layer of other material on buffer layer 62 and by patterning the deposited layer using photolithographic patterning (as an example).

At step 114, buffer layer 66 (e.g., silicon oxide and/or silicon nitride or other inorganic dielectric) may be formed on top of etch stop layer 64ES and on top of other structures such as structures 64D.

At step 116, polysilicon 68 or other thin-film transistor material may be deposited and patterned (e.g., using a low-temperature polysilicon deposition process and photolithographic patterning).

At step 118, gate insulator 70 may be formed on top of patterned polysilicon structures 68.

At step 120, first metal layer 72 may be formed on top of gate insulator 70. For example, a layer of metal may be deposited by sputtering or other deposition processes and may be patterned using photolithographic patterning techniques.

At step 122, interlayer dielectric 74 may be deposited on metal layer 72. Interlayer dielectric 74 may include one or more sublayers of dielectric material.

At step 124, photolithographic patterning (e.g., photoresist patterning followed by etching using dry etching tools or other semiconductor processing equipment) may be used to form vias 78. During the same dry etch process in which vias 78 are formed, interlayer dielectric 74 may be removed from inactive region IA (i.e., from some or all of region IA, including the portions of region IA that overlap the position of bend axis 44). Etch stop 64ES stops the etching process, so that the structures in region IA are not etched excessively.

At step 126, a wet etch or other removal process may be used to remove etch stop 64ES. This exposes buffer layer 62 in inactive area IA without damaging buffer layer 62. Structures 64D may remain in active area AA.

At step 128, second metal layer 80 may be formed on display 14. For example, a layer of metal 80 may be deposited and pattered using photolithographic patterning techniques. Patterned metal layer 80 may form structures such as signal lines 48 and contacts 48P in inactive area IA.

At step 130, a dielectric passivation layer such as passivation layer 82 may be formed on top of metal layer 80.

At step 132, openings may be formed in passivation layer 82 for forming contacts. For example, an opening may be formed at the bottom of selected vias 78 (e.g., anode vias) to expose underlying metal 80 and openings may be formed in regions 90 to expose metal 80.

At step 132, planarization layer 84 may be formed from a polymer (plastic) or other material. Layer 84 may be photolithographically patterned to form openings in alignment with some of vias 78 (e.g., anode vias) and contact regions 90.

At step 136, another layer of patterned metal structures may be formed on display 14. For example, third metal layer 86 may be deposited and patterned using photolithographic patterning, thereby forming anode contacts with second metal layer 80 in active area AA and forming contact pads 48P in inactive area IA.

At step 138, polymer layer 92 (sometimes referred to as a neutral stress plane adjustment layer) may be deposited, as shown in FIG. 12. Display 14 may then be bent along bend axis 44 or other suitable bend axis to form one or more bent edges for display 14. The bent display may be installed within housing 12 to form a finished electronic device such as device 10 of FIGS. 1, 2, 3, and 4.

The foregoing is merely illustrative of the principles of this invention and various modifications can be made by those skilled in the art without departing from the scope and spirit of the invention.

What is claimed is:

1. A method of forming a display having an active area and an inactive area, the method comprising:

depositing a buffer layer on a polymer substrate;
depositing semiconductor transistor structures on the buffer layer;
forming an etch stop layer directly on the buffer layer;
depositing interlayer dielectric on the etch stop layer over a bend axis in the inactive region of the display;
removing the interlayer dielectric over the bend axis; and
bending the display along the bend axis after removing the interlayer dielectric over the bend axis.

2. The method defined in claim 1 wherein depositing the semiconductor transistor structures comprises depositing the semiconductor transistor structures in the active area.

3. The method defined in claim 2 wherein bending the display comprises bending the display at a right angle.

4. The method defined in claim 2 wherein forming the etch stop layer comprises depositing a layer of material, the method further comprising patterning the layer of material to form the etch stop layer and to form structures in the active area.

5. The method defined in claim 4 wherein depositing the layer of material comprises depositing a layer of metal.

6. A method of forming a display having an active area and an inactive area, comprising:
depositing a buffer layer on a polymer substrate;
depositing semiconductor transistor structures on the buffer layer in the active area;
depositing a layer of metal on the buffer layer;
patterning the layer of metal to form an etch stop layer on the buffer layer and to form structures in the active area;
depositing interlayer dielectric over the etch stop layer;
removing the interlayer dielectric over the etch stop layer;
removing the etch stop layer; and
bending the display along a bend axis after removing the etch stop layer.

7. The method defined in claim 6 wherein removing the etch stop layer comprises wet etching.

8. The method defined in claim 6 further comprising forming metal traces after removing the etch stop layer.

9. The method defined in claim 8 further comprising depositing a polymer neutral stress plane adjustment layer over the metal traces overlapping the bend axis before bending the display.

10. A method of forming a display with an active area and an inactive area, comprising:
depositing an etch stop that prevents over etching of a dielectric layer in the inactive area while etching an interlayer dielectric; and
removing the etch stop over a bend axis after etching the interlayer dielectric; and
bending the display along the bend axis.

11. The method defined in claim 10 further comprising coupling display pixels in the active area to contacts in the inactive area using metal traces that overlap the bend axis.

12. The method defined in claim 11 wherein the display includes a flexible polymer substrate having a surface, wherein the dielectric layer is a buffer layer on the surface of the flexible polymer substrate, and wherein coupling the display pixels comprises forming the metal traces on the buffer layer.

13. The method defined in claim 12 further comprising depositing a neutral stress plane adjustment layer on the metal traces before bending the display along the bend axis.

14. The method defined in claim 10 wherein depositing the etch stop comprises depositing a metal layer.

15. The method defined in claim 10 wherein depositing the etch stop comprises depositing a layer containing indium.

16. The method defined in claim 10 wherein depositing the etch stop comprises depositing an oxide layer that contains indium.

* * * * *